United States Patent
Liang et al.

(10) Patent No.: US 8,617,986 B2
(45) Date of Patent: Dec. 31, 2013

(54) INTEGRATED CIRCUITS AND METHODS FOR FORMING THE INTEGRATED CIRCUITS

(75) Inventors: Ming-Chung Liang, Hsinchu (TW); Chii-Ping Chen, Taichung (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 83 days.

(21) Appl. No.: 12/841,321

(22) Filed: Jul. 22, 2010

(65) Prior Publication Data

US 2011/0108994 A1 May 12, 2011

Related U.S. Application Data

(60) Provisional application No. 61/259,394, filed on Nov. 9, 2009.

(51) Int. Cl.
*H01L 21/44* (2006.01)
(52) U.S. Cl.
USPC .......................................... 438/666; 257/774
(58) Field of Classification Search
USPC .......... 257/774, E21.585, E23.011, 209, 635; 438/635, 393, 687, 666, 301
See application file for complete search history.

(56) References Cited

U.S. PATENT DOCUMENTS

| | | | | |
|---|---|---|---|---|
| 5,026,666 | A * | 6/1991 | Hills et al. | 438/301 |
| 6,342,448 | B1 * | 1/2002 | Lin et al. | 438/687 |
| 2004/0097099 | A1 * | 5/2004 | Li et al. | 438/766 |
| 2004/0266125 | A1 * | 12/2004 | Shin et al. | 438/393 |
| 2007/0158690 | A1 * | 7/2007 | Ho et al. | 257/209 |
| 2008/0233738 | A1 * | 9/2008 | Beyer et al. | 438/643 |
| 2009/0167975 | A1 * | 7/2009 | Lee et al. | 349/43 |
| 2009/0267198 | A1 * | 10/2009 | Tada et al. | 257/635 |

FOREIGN PATENT DOCUMENTS

| | | |
|---|---|---|
| CN | 101000885 | 7/2007 |
| JP | 8264534 | 10/1996 |
| JP | 2004259753 | 9/2004 |
| JP | 2008186926 | 8/2008 |

OTHER PUBLICATIONS

Office Action dated Jan. 29, 2013 from corresponding application No. JP 2010-250254.

\* cited by examiner

*Primary Examiner* — Vongsavanh Sengdara
(74) *Attorney, Agent, or Firm* — Lowe Hauptman & Ham, LLP

(57) ABSTRACT

A method for forming an integrated circuit includes forming a first dielectric layer over a gate electrode of a transistor. An etch-stop layer is formed over the first dielectric layer. An opening is formed through the first dielectric layer and the etch-stop layer, exposing a source/drain (S/D) region of the transistor. A metal layer is formed in the opening, contacting the S/D region of the transistor. The metal layer has a surface that is at least partially substantially level with a first top surface of the etch-stop layer. A damascene structure is formed and coupled with the metal layer.

20 Claims, 9 Drawing Sheets

INTEGRATED CIRCUITS AND METHODS FOR FORMING THE INTEGRATED CIRCUITS

CROSS-REFERENCE TO RELATED APPLICATIONS

The present application claims priority of U.S. Provisional Patent Application Ser. No. 61/259,394, filed on Nov. 9, 2009 which is incorporated herein by reference in its entirety.

TECHNICAL FIELD

The present disclosure relates generally to the field of semiconductor circuits, and more particularly, to integrated circuits and methods for forming the integrated circuits.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

DETAILED DESCRIPTION

Figure 1A:
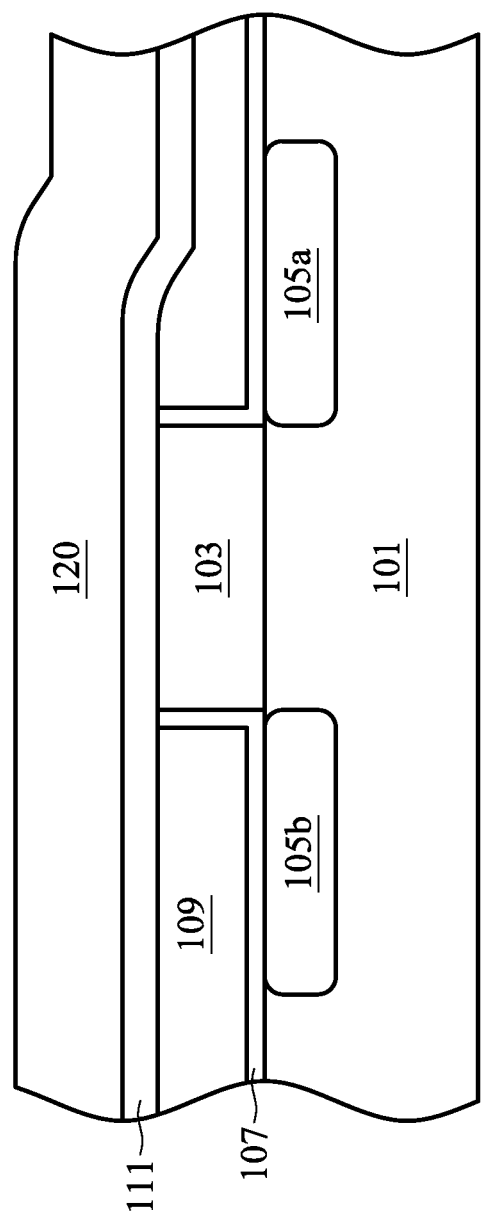
FIGS. 1A-1H are schematic cross-sectional views illustrating an exemplary method for forming an integrated circuit.

A known method for forming a contact metal layer coupled with a via layer includes forming an interlayer dielectric (ILD) layer over a metal gate electrode of a transistor. A contact opening is then formed in the ILD layer, exposing a source/drain (S/D) region of the transistor. A metal material is then formed in the contact opening and over the ILD layer. A chemical-mechanical polish (CMP) process is performed to remove the metal material over the ILD layer, forming the contact metal layer in the remaining ILD layer. The CMP process can also planarize surfaces of the remaining ILD layer and the contact metal layer such that the surface of the remaining ILD layer is leveled with that of the contact metal layer. It is found that the thicknesses of the remaining ILD layer on areas with and without the metal gate electrode are different. That is the thickness of the remaining ILD layer directly on the gate electrode is smaller than that on the area without the metal gate electrode.

After planarizing the surfaces of the remaining ILD layer and the contact metal layer, an etch-stop layer is deposited on the remaining ILD layer and the contact metal layer. An inter-metal dielectric (IMD) layer is then deposited on the etch-stop layer. A dual-damascene opening is formed in the IMD layer, exposing the contact metal layer. In order to form the dual-damascene opening, a via etch process and/or a trench etch process are performed to etch through the etch-stop layer for exposing the contact metal layer.

As noted, the remaining ILD layer directly on the gate electrode becomes thinner after the CMP process. The via etch process and/or the trench etch process that etch through the etch-stop layer may undesirably recess the remaining ILD layer and/or reach the metal gate electrode. If a metal material for forming a dual-damascene metal layer fills in the recess in the remaining ILD layer, the metal material contacts the metal gate electrode. The dual-damascene metal layer become short circuited with the metal gate electrode.

Based on the foregoing, methods for forming an integrated circuit are desired.

It is understood that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIGS. 1A-1H are schematic cross-sectional views illustrating an exemplary method for forming an integrated circuit. In FIG. 1A, a gate electrode 103 of a transistor (not labeled) can be formed over a substrate 101. At least one source/drain (S/D) region, e.g., S/D regions 105a and 105b, of the transistor can be formed in the substrate 101 and adjacent to the gate electrode 103. An etch-stop layer 107 can be formed over the substrate 101 and adjacent to sidewalls of the gate electrode 103. A dielectric layer 109 can be formed over the etch-stop layer 107. An etch stop layer 111 can be formed over the gate electrode 103 and the dielectric layer 109. A dielectric layer 120 can be formed over the etch-stop layer 111. In various embodiments, the formation of the etch-stop layer 107 and/or the dielectric layer 109 is optional. The structure described in conjunction with FIG. 1A is merely exemplary. The scope of invention is not limited thereto.

In various embodiments, the substrate 101 can include an elementary semiconductor including silicon or germanium in crystal, polycrystalline, or an amorphous structure; a compound semiconductor including silicon carbide, gallium arsenide, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In one embodiment, the alloy semiconductor substrate may have a gradient SiGe feature in which the Si and Ge composition changes from one ratio at one location to another ratio at another location of the gradient SiGe feature. In another embodiment, the alloy SiGe is formed over a silicon substrate. In another embodiment, a SiGe substrate is strained. Furthermore, the semiconductor substrate may be a semiconductor on insulator, such as a silicon on insulator (SOI), or a thin film transistor (TFT). In some examples, the semiconductor substrate may include a doped epi layer or a buried layer. In other examples, the compound semiconductor substrate may have a multilayer structure, or the substrate may include a multilayer compound semiconductor structure.

The gate electrode 103 can be formed by a gate-first process or a gate-last process. The gate electrode 103 can include polysilicon, silicon-germanium, a metallic material including metal compounds such as, Mo, Cu, W, Ti, Ta, TiN, TaN, NiSi, CoSi, and/or other suitable conductive materials known in the art. In other embodiments, the gate electrode 103 can include a work function metal layer such that it provides an N-metal work function or P-metal work function of a metal gate. P-type work function materials include compositions such as ruthenium, palladium, platinum, cobalt, nickel, and conductive metal oxides, and/or other suitable materials. N-type work function materials include compositions such as hafnium, zirconium, titanium, tantalum, aluminum, metal carbides (e.g., hafnium carbide, zirconium carbide, titanium carbide, aluminum carbide), aluminides, and/or other suitable materials. The gate electrode 103 can be formed by any suitable process, such as atomic layer deposition (ALD), chemical vapor deposition (CVD), wet oxidation, physical vapor deposition (PVD), remote plasma CVD (RPCVD), plasma enhanced CVD (PECVD), metal organic CVD (MOCVD), sputtering, plating, other suitable processes, and/or combinations thereof.

In various embodiments, a gate dielectric structure (not shown) can be disposed below the gate electrode 103. The gate dielectric structure can have a single layer or a multi-layer structure. In various embodiments for multi-layer structures, the gate dielectric structure can include an interfacial layer and a high-k dielectric layer. The interfacial layer can include dielectric material such as, silicon oxide, silicon nitride, silicon oxinitride, other dielectric materials, and/or the combinations thereof. The high-k dielectric layer can include high-k dielectric materials such as $HfO_2$, HfSiO, HfSiON, HfTaO, HfSiO, HfZrO, other suitable high-k dielectric materials, and/or combinations thereof. The high-k material may further be selected from metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina alloy, other suitable materials, and/or combinations thereof.

The S/D regions 105a and 105b can be formed in the substrate 101. In various embodiments forming N-type transistor, the S/D regions 105a and 105b can have dopants such as Arsenic (As), Phosphorus (P), other group V element, or any combinations thereof. For embodiments forming P-type transistor, the S/D regions 105a and 105b can have dopants such as boron (B), other group III element, or any combinations thereof. The S/D regions 105a and 105b can be formed by any suitable process, such as ion implantation and/or a rapid thermal process (RTP) to activate the S/D regions 105a and 105b.

The etch-stop layers 107 and 111 can have at least one material such as silicon carbide (SiC), silicon nitride (SiN), silicon carbon nitride (SiCN), silicon carbon oxide (SiCO), silicon oxynitride (SiON), boron nitride (BN), boron carbon nitride (BCN), other material that has a desired selectivity with respect to silicon oxide, or any combinations thereof. The etch-stop layers 107 and 111 can be formed by any suitable process, such as atomic layer deposition (ALD), chemical vapor deposition (CVD), wet oxidation, physical vapor deposition (PVD), remote plasma CVD (RPCVD), plasma enhanced CVD (PECVD), metal organic CVD (MOCVD), sputtering, plating, other suitable processes, and/or combinations thereof.

The dielectric layers 109 and 120 can include materials such as oxide, e.g., high density plasma (HDP) oxide, plasma enhanced (PE) oxide, tetraethyl orthosilicate (TEOS), phosphosilicate glass (PSG), borophosphosilicate glass (BPSG), low-k dielectric material, ultra low-k dielectric material, or any combinations thereof. In various embodiments, the dielectric layers 109 and 120 can be formed by chemical vapor deposition (CVD), e.g., HDPCVD or PECVD, physical vapor deposition (PVD), remote plasma CVD (RPCVD), plasma enhanced CVD (PECVD), metal organic CVD (MOCVD), sputtering, plating, other suitable processes, and/or combinations thereof. In various embodiments, the dielectric layers 109 and 120 can be referred to as interlayer dielectric (ILD) layers.

Figure 1B:
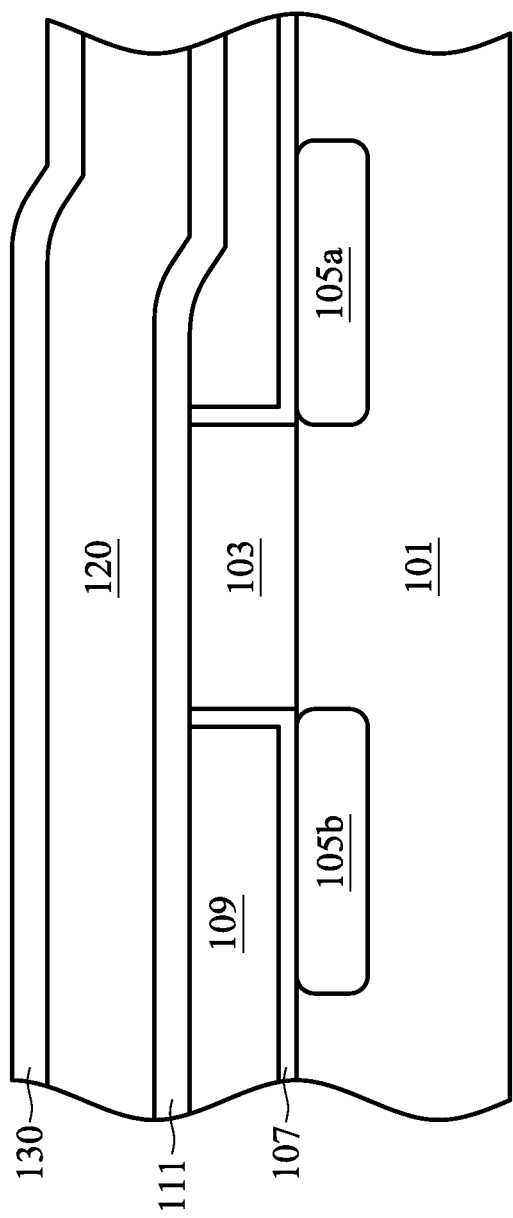

Referring to FIG. 1B, an etch-stop layer 130 can be formed over the dielectric layer 120. The etch-stop layer 130 can serve as an etch-stop layer for a removing process, e.g., a chemical-mechanical polish (CMP) process, described below. The etch-stop layer 130 can have at least one material such as silicon carbide (SiC), silicon nitride (SiN), silicon carbon nitride (SiCN), silicon carbon oxide (SiCO), silicon oxynitride (SiON), boron nitride (BN), boron carbon nitride (BCN), other material that has an etch selectivity higher than that of silicon oxide, or any combinations thereof. In various embodiments, the etch-stop layer 130 can be formed by any suitable process, such as atomic layer deposition (ALD), chemical vapor deposition (CVD), wet oxidation, physical vapor deposition (PVD), remote plasma CVD (RPCVD), plasma enhanced CVD (PECVD), metal organic CVD (MOCVD), sputtering, plating, other suitable processes, and/or combinations thereof.

Figure 1C:
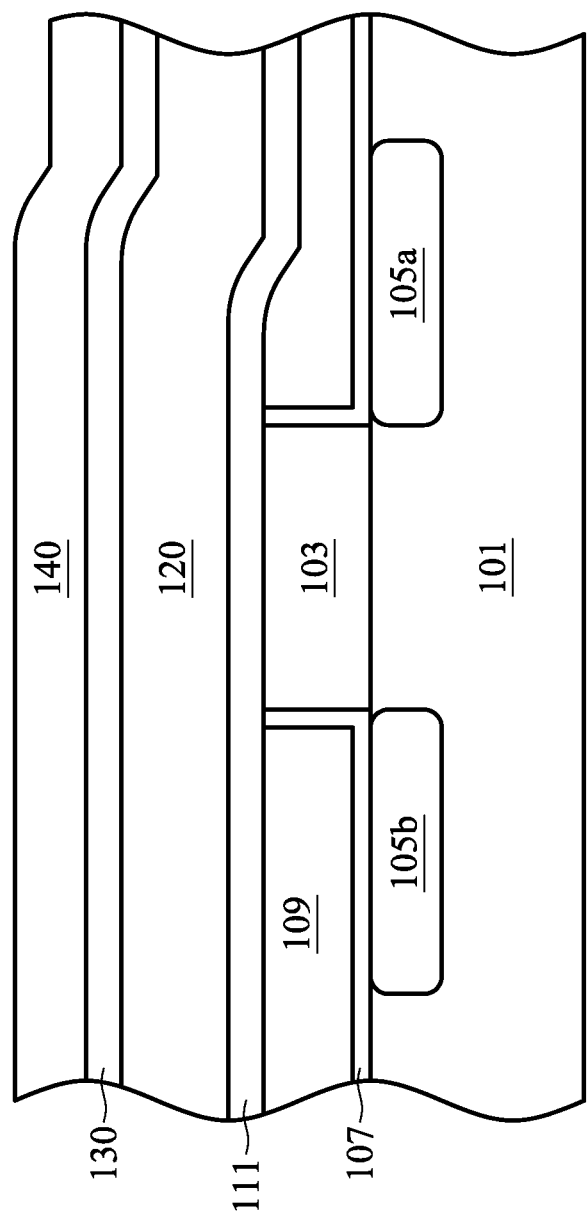

Referring to FIG. 1C, a dielectric layer 140 can be optionally formed over the etch-stop layer 130. The dielectric layer 140 can serve as an over-polish layer for the removing process, e.g., a chemical-mechanical polish (CMP) process, described below. In various embodiments, the dielectric layer 140 can desirably protect the etch-stop layer 130 from being subjected to a sputtering process, e.g., an etch process, and prevent carbon outgassing from the etch-stop layer 130. In still other embodiments, the dielectric layer 140 can desirably protect the etch-stop layer 130 from being subjected to a sputtering process, e.g., an etch process. The material of the etch-stop layer 130 is substantially free from being changed such that the etch selectivity of the etch-stop layer 130 to etch and/or CMP processes is substantially free from being degraded.

In various embodiments using a 22-nm technology, the etch-stop layer 130 can be deposited to a thickness of about 250 Å or more and the dielectric layer 140 can be deposited to a thickness of about 400 Å or more. The dielectric layer 140 can provide a desired over-polish margin for the CMP process. In other embodiments, the etch-stop layer 130 can itself provide the desired over-polish margin for the CMP process. For example, if the etch-stop layer 130 is deposited to a thickness of about 550 Å or more, the dielectric layer 140 is not required.

In various embodiments, the dielectric layer 140 can include materials such as oxide, e.g., high density plasma (HDP) oxide, plasma enhanced (PE) oxide, tetraethyl orthosilicate (TEOS), phosphosilicate glass (PSG), borophosphosilicate glass (BPSG), low-k dielectric materials, ultra low-k dielectric materials, or any combinations thereof. In various embodiments, the dielectric layer 140 can be formed by chemical vapor deposition (CVD), e.g., HDPCVD or PECVD, physical vapor deposition (PVD), remote plasma CVD (RPCVD), plasma enhanced CVD (PECVD), metal organic CVD (MOCVD), sputtering, plating, other suitable processes, and/or combinations thereof.

Figure 1D:
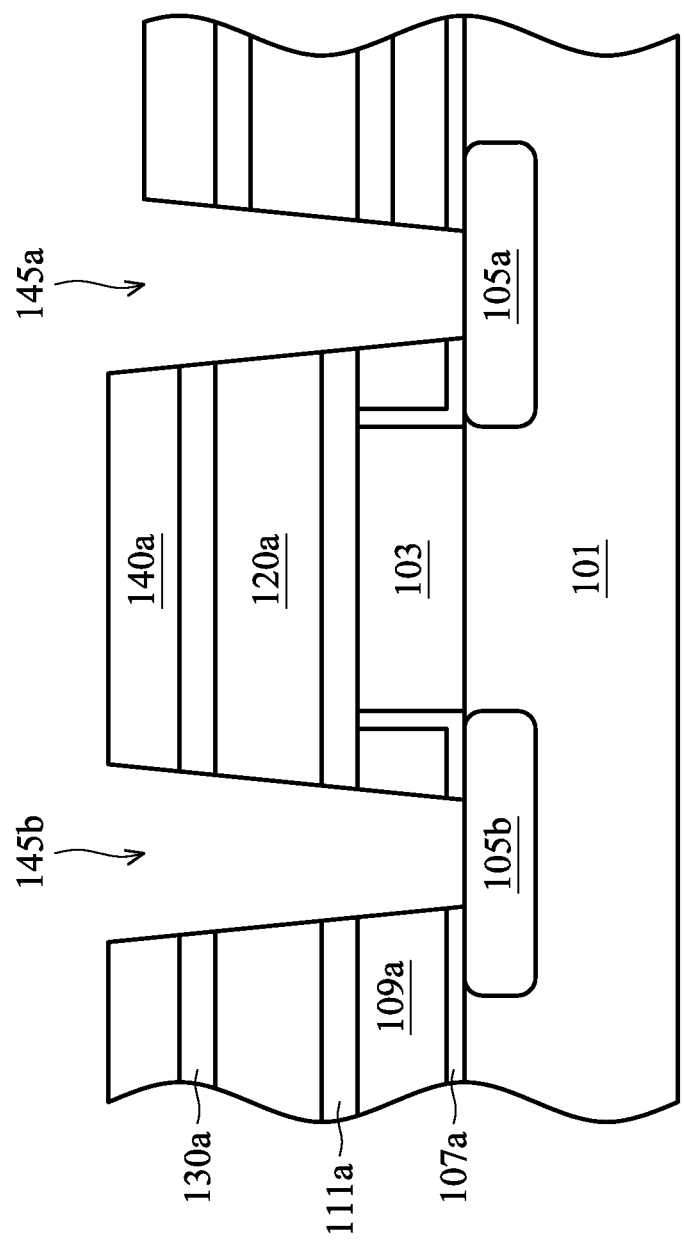

Referring to FIG. 1D, an etch process can remove portions of the etch-stop layers 107, 111, and 130, and the dielectric layers 109, 120, and 140, defining at least one opening, e.g., contact openings 145a and 145b. The contact openings 145a and 145b can be formed through the etch-stop layers 107a, 111a, and 130a, and the dielectric layers 109a, 120a, and 140a. The contact openings 145a and 145b can expose at least portions of surfaces of the S/D regions 105a and 105b, respectively.

In various embodiments, a silicide structure (not shown) can be formed on the exposed surfaces of the S/D regions 105a and 105b. The silicide structure may comprise materials such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable materials, and/or combinations thereof.

Figure 1E:
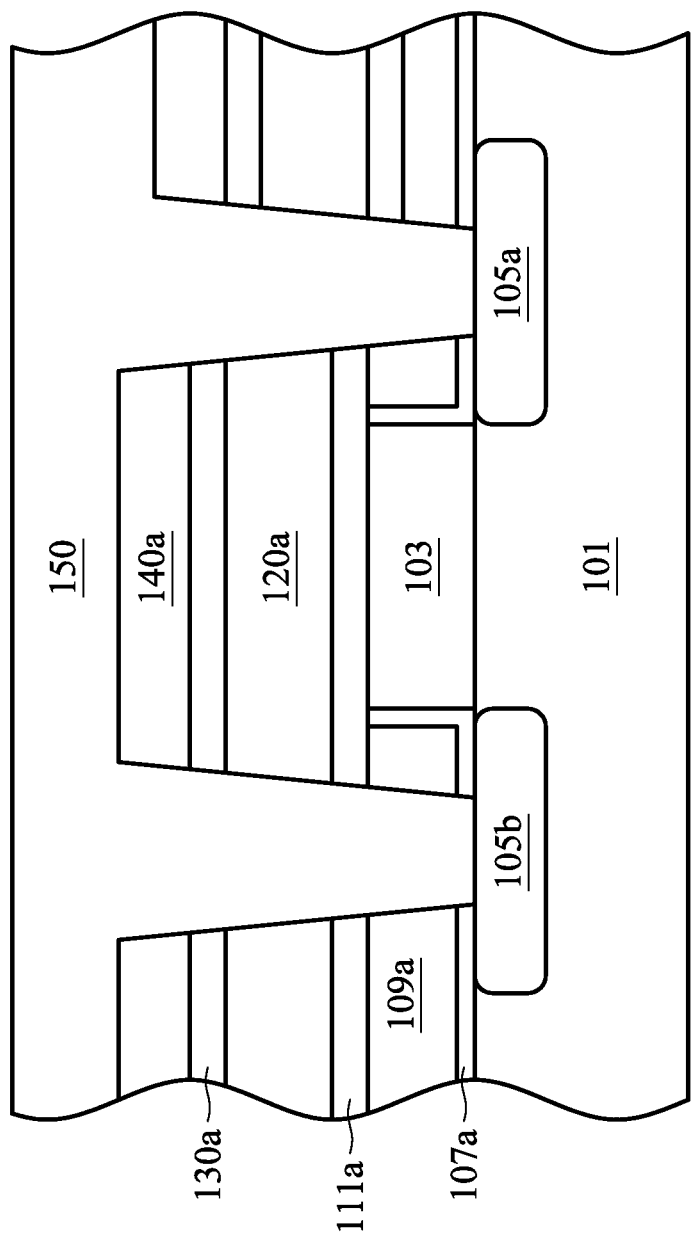

Referring to FIG. 1E, a metal material 150 can be formed in the contact openings 145a and 145b and the dielectric layer 140a. In various embodiments, the metal material 150 can include materials such as tungsten, aluminum, copper, titanium, tantalum, titanium nitride, tantalum nitride, nickel silicide, cobalt silicide, other proper conductive materials, and/or combinations thereof. The metal material 150 can be formed by, for example, depositing a metallic material by CVD, ALD, PVD, and/or suitable processes over the dielectric layer 140a.

Figure 1F:
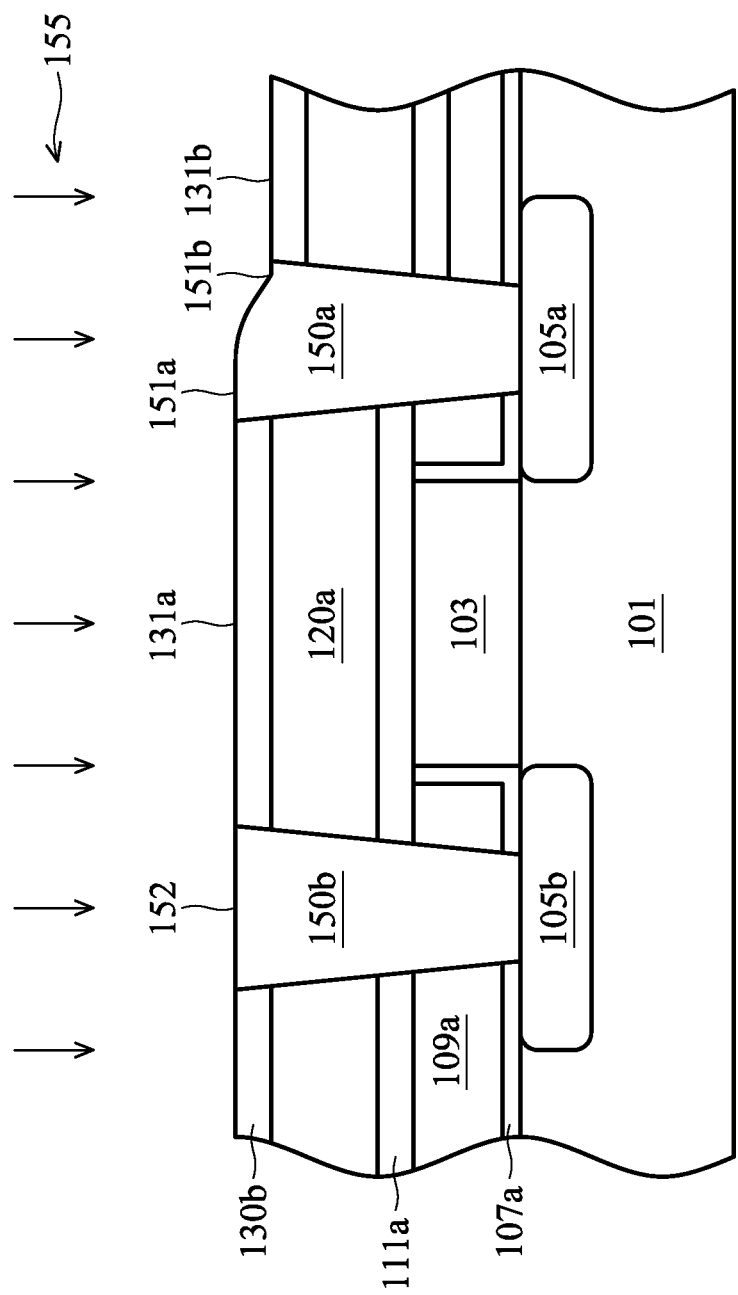

Referring to FIG. 1F, a removing process 155, e.g., a CMP process, can remove a portion of the metal material 150 over the etch stop layer 130a and the dielectric layer 140a (shown in FIG. 1E), forming metal layers 150a and 150b. The removing process 155 can have a desired etch selectivity of the metal material 155 to the etch-stop layer 130a. The etch selectivity can be about 5 or more. In various embodiments, the removing process 155 can remove a portion of the etch-stop layer 130a, leaving the etch-stop layer 130b. The thickness of the etch-stop layer 130b can be smaller than that of the etch-stop layer 130a.

In various embodiments using the dielectric layer 140a, the dielectric layer 140a can be completely or substantially removed by the removing process 155. The etch-stop layer 130b can have a remaining thickness of about 150 Å or more. In other embodiments, the etch-stop layer 130b can itself provide the desired over-polish margin for the CMP process. For example, the etch-stop layer 130 (shown in FIG. 1B) is deposited to a thickness of about 550 Å or more. After the removing process 155, the etch-stop layer 130b can have a remaining thickness of about 150 Å or more.

Referring again to FIG. 1F, the etch-stop layer 130b can have top surfaces 131a and 131b. Due to the step height resulting from the gate electrode 103, the top surfaces 131a and 131b may not be leveled with each other. In various embodiments, the metal layer 150a can be formed at the interface between the top surfaces 131a and 131b. The metal layer 150a can have a surface 151a that is substantially leveled with the top surface 131a. The metal layer 150a can have another surface 151b that is substantially leveled with the top surface 131b. The metal layer 150b can have a surface 152 that is substantially leveled with the top surface 131a. In various embodiments, the metal layers 150a and 150b can be referred to as "Metal 0" layers.

Figure 1G:
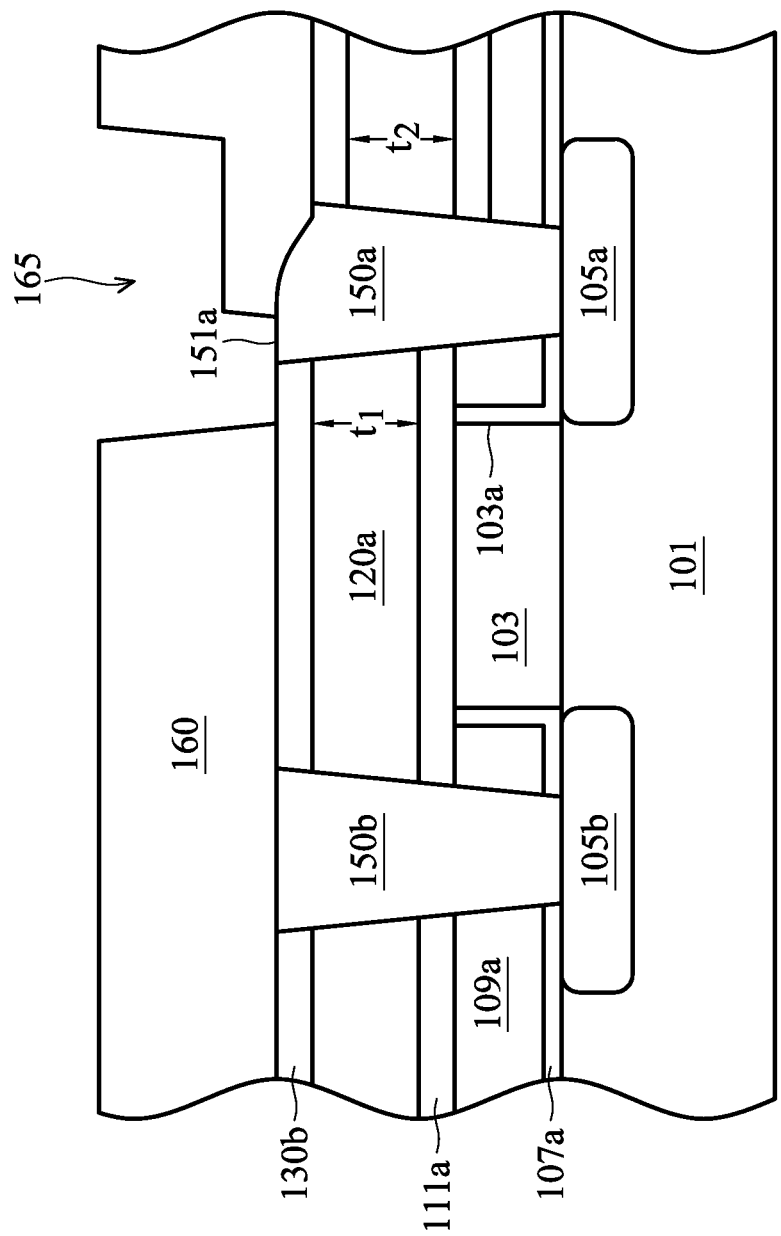

Referring to FIG. 1G, a dielectric layer 160 can be formed over the etch-stop layer 130b. A damascene opening 165, e.g., a single damascene opening or a dual-damascene opening, can be formed in the dielectric layer 160, exposing the surface 151a of the metal layer 150a. The etch-stop layer 130b can serve as the etch-stop layer for forming the damascene opening 165. The etch-stop layer 130b can desirably protect the dielectric layer 120a from being recessed by an via etch process and/or a trench process for forming the damascene opening 165. The dielectric layer 120a that is directly over the gate electrode 103 can have a thickness "$t_1$" that is substantially equal to that "$t_2$" of the dielectric layer 120a in the area without the gate electrode 103.

Figure 1H:
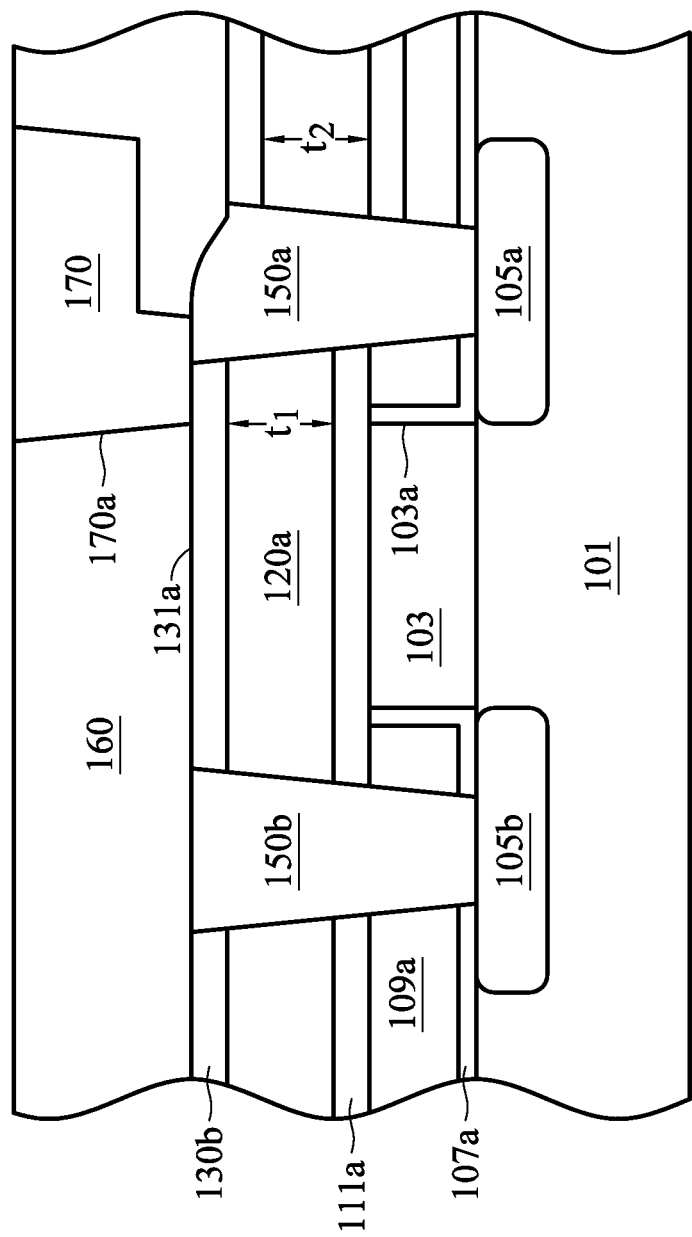

Referring to FIG. 1H, a damascene structure 170, e.g., a single damascene structure or a dual-damascene structure, can be formed in the damascene opening 165, contacting the metal layer 150a. In various embodiments, an edge 170a of the damascene structure 170 can be substantially aligned with an edge 103a of the gate electrode 103 in the direction substantially orthogonal to the top surface 131a. For embodiments forming a dual-damascene structure, the damascene structure 170 can include a via plug and a metal line. The via plug can be referred to as a "VIA 0" layer and the metal line can be referred to as a "Metal 1" layer.

In various embodiments, the damascene structure 170 can include materials such as tungsten, aluminum, copper, titanium, tantalum, titanium nitride, tantalum nitride, nickel silicide, cobalt silicide, other proper conductive materials, and/or combinations thereof. The damascene structure 170 can be formed by, for example, depositing a metallic material by CVD, ALD, PVD, and/or suitable removing processes, e.g., CMP, in the dielectric layer 160.

In various embodiments, additional dielectric materials, via plugs, metallic regions, and/or metallic lines can be formed over the dielectric layer 160 for interconnection. The via plugs, metallic regions, and/or metallic lines can include materials such as tungsten, aluminum, copper, titanium, tantalum, titanium nitride, tantalum nitride, nickel silicide, cobalt silicide, other proper conductive materials, and/or combinations thereof. The via plugs, metallic regions, and/or metallic lines can be formed by any suitable processes, such as deposition, photolithography, and etching processes, and/or combinations thereof.

Figure 2:
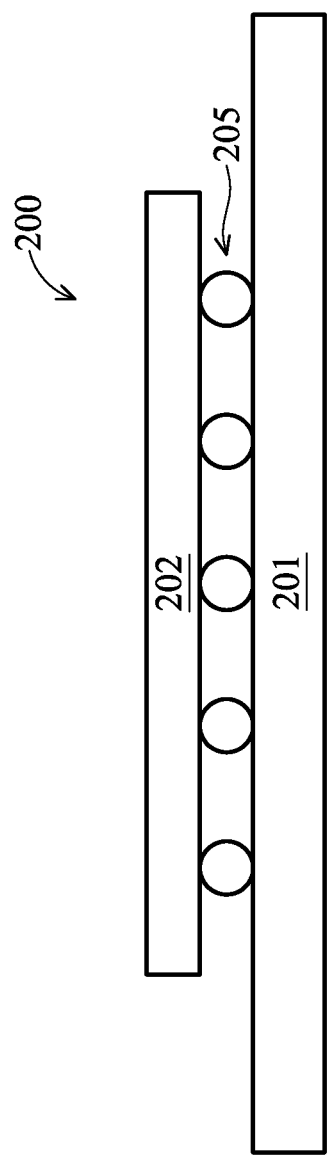
FIG. 2 is a schematic drawing illustrating a system including an exemplary integrated circuit disposed over a substrate board.

FIG. 2 is a schematic drawing illustrating a system including an exemplary integrated circuit disposed over a substrate board. In FIG. 2, a system 200 can include an integrated circuit 202 disposed over a substrate board 201. The substrate board 201 can include a printed circuit board (PCB), a printed wiring board and/or other carrier that is capable of carrying an integrated circuit. The integrated circuit 202 can include the structure formed by the method described above in conjunction with FIGS. 1A-1H. The integrated circuit 202 can be electrically coupled with the substrate board 201. In various embodiments, the integrated circuit 202 can be electrically coupled with the substrate board 201 through bumps 205. In other embodiments, the integrated circuit 202 can be electrically coupled with the substrate board 201 through wire bonding. The system 200 can be part of an electronic system such as computers, wireless communication devices, computer-related peripherals, entertainment devices, or the like.

In various embodiments, the system 200 including the integrated circuit 202 can provides an entire system in one IC, so-called system on a chip (SOC) or system on integrated circuit (SOIC) devices. These SOC devices may provide, for example, all of the circuitry needed to implement a cell phone, personal data assistant (PDA), digital VCR, digital camcorder, digital camera, MP3 player, or the like in a single integrated circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated circuit, said method comprising:
   forming a first dielectric layer over a gate electrode of a transistor;
   forming an etch-stop layer over the first dielectric layer, the etch-stop layer further has a first top surface and a second top surface, the first top surface is not level with the second top surface;
   forming an opening through the first dielectric layer and the etch-stop layer, exposing a source/drain (S/D) region of the transistor;
   forming a metal layer in the opening, contacting the S/D region of the transistor,
   the metal layer having a first surface that extends substantially parallel to an interface between the first dielectric layer and the etch-stop layer and is substantially level with the first top surface of the etch-stop layer, the metal layer is formed at an interface of the first top surface and the second top surface; and
   forming a damascene structure coupled with the metal layer.

2. The method of claim 1, wherein said forming the metal layer in the opening comprises:
   forming a metal material in the opening and over the etch-stop layer; and
   removing a portion of the metal material over the etch-stop layer and a portion of the etch-stop layer to obtain the metal layer.

3. The method of claim 2, wherein the etch-stop layer is deposited to a thickness of about 550 Å or more, the removing has an etch selectivity of the metal material to the etch-stop layer of about 5 or more, and after the removing, the etch-stop layer has a remaining thickness of about 150 Å or more.

4. The method of claim 1, further comprising:
   forming a second dielectric layer over the etch-stop layer; and
   forming the opening through the second dielectric layer.

5. The method of claim 4, wherein said forming the metal layer in the opening comprises:
   forming a metal material in the opening and over the second dielectric layer; and
   removing a portion of the metal material over the second dielectric layer and at least a portion of the second dielectric layer to obtain the metal layer.

6. The method of claim 5, wherein the etch-stop layer is deposited to a thickness of about 250 Å or more and the removing has an etch selectivity of the metal material to the etch-stop layer of about 5 or more.

7. The method of claim 1, wherein said forming the damascene structure comprises:
   forming a damascene opening in a second dielectric layer over the etch-stop layer, while using the etch-stop layer for protecting the first dielectric layer; and
   forming the damascene structure in the damascene opening.

8. The method of claim 1, wherein forming the etch stop layer comprises forming a layer comprising at least one of silicon carbide, silicon nitride, silicon carbon nitride, silicon carbon oxide, silicon oxynitride, boron nitride, boron carbon nitride.

9. A method for forming an integrated circuit, said method comprising:
   forming a first dielectric layer over a gate electrode of a transistor;
   forming an etch-stop layer over the first dielectric layer;
   forming a second dielectric layer over the etch-stop layer;
   forming an opening through the second dielectric layer, the etch-stop layer, and the first dielectric layer, exposing a source/drain (S/D) region of the transistor;
   forming a metal material in the opening and over the second dielectric layer;
   removing a portion of the metal material over the second dielectric layer and reducing a thickness of at least a portion of the second dielectric layer in a direction perpendicular to an interface between the first dielectric layer and the etch-stop layer to obtain a metal layer in the opening, the removing has an etch selectivity of the metal material to the etch-stop layer of about 5 or more; and
   forming a damascene structure coupled with the metal layer.

10. The method of claim 9, wherein the metal layer is coupled with the S/D region of the transistor and the metal layer has at least a first surface that is substantially level with a first top surface of the etch-stop layer.

11. The method of claim 10, wherein the etch-stop layer further has a second top surface, the first top surface is not leveled with the second top surface, and the metal layer is formed at an interface of the first top surface and the second top surface.

12. The method of claim 9, wherein the etch-stop layer is deposited to a thickness of about 250 Å or more.

13. The method of claim 9, wherein said forming the damascene structure comprises:
   forming a damascene opening in a third dielectric layer over the etch-stop layer, while using the etch-stop layer for protecting the first dielectric layer; and
   forming the damascene structure in the damascene opening.

14. The method of claim 9, wherein forming the etch stop layer comprises forming a layer comprising at least one of silicon carbide, silicon nitride, silicon carbon nitride, silicon carbon oxide, silicon oxynitride, boron nitride, boron carbon nitride.

15. A method for forming an integrated circuit, said method comprising:

forming a first dielectric layer over a gate electrode of a transistor;

forming an etch-stop layer over the first dielectric layer, the etch-stop layer further has a first top surface and a second top surface, the first top surface is not level with the second top surface;

forming a second dielectric layer over the etch-stop layer;

forming an opening through the second dielectric layer, the etch-stop layer, and the first dielectric layer, exposing a source/drain (S/D) region of the transistor;

forming a metal material in the opening and over the second dielectric layer, the metal layer is formed at an interface of the first top surface and the second top surface;

removing a portion of the metal material over the second dielectric layer and at least a portion of the second dielectric layer to obtain a metal layer in the opening; and forming a damascene structure coupled with the metal layer.

16. The method of claim 15, wherein the metal layer is coupled with the S/D region of the transistor and the metal layer has at least a first surface that is substantially level with a first top surface of the etch-stop layer.

17. The method of claim 15, wherein the etch-stop layer is deposited to a thickness of about 250 Å or more and the removing has an etch selectivity of the metal material to the etch-stop layer of about 5 or more.

18. The method of claim 15, wherein the etch-stop layer further has a second top surface, the first top surface is not leveled with the second top surface, and the metal layer is formed at an interface of the first top surface and the second top surface.

19. The method of claim 15, wherein said forming the damascene structure comprises:

forming a damascene opening in a third dielectric layer over the etch-stop layer, while using the etch-stop layer for protecting the first dielectric layer; and forming the damascene structure in the damascene opening.

20. The method of claim 15, wherein forming the etch stop layer comprises forming a layer comprising at least one of silicon carbide, silicon nitride, silicon carbon nitride, silicon carbon oxide, silicon oxynitride, boron nitride, boron carbon nitride.

* * * * *